United States Patent
Lin et al.

(10) Patent No.: US 10,133,133 B1
(45) Date of Patent: Nov. 20, 2018

(54) LIQUID CRYSTAL DISPLAY BASE

(71) Applicant: ADVANCED OPTOELECTRONIC TECHNOLOGY, INC., Hsinchu Hsien (TW)

(72) Inventors: Hsin-Chiang Lin, Hsinchu (TW); Chien-Cheng Kuo, Hukou (TW); Pin-Chuan Chen, Hsinchu (TW); Lung-Hsin Chen, Hsinchu (TW); Wen-Liang Tseng, Hsinchu (TW)

(73) Assignee: ADVANCED OPTOELECTRONIC TECHNOLOGY, INC, Hsinchu Hsien (TW)

( * ) Notice: Subject to any disclaimer, the term of this patent is extended or adjusted under 35 U.S.C. 154(b) by 0 days.

(21) Appl. No.: 15/636,582

(22) Filed: Jun. 28, 2017

(51) Int. Cl.
  *G02F 1/1345* (2006.01)
  *G02F 1/1368* (2006.01)
  *H01L 27/12* (2006.01)

(52) U.S. Cl.
  CPC ........ *G02F 1/13452* (2013.01); *G02F 1/1368* (2013.01); *H01L 27/124* (2013.01)

(58) Field of Classification Search
  CPC ... G02F 1/13452; G02F 1/1368; H01L 27/124
  USPC .......................................................... 349/149
  See application file for complete search history.

(56) References Cited

U.S. PATENT DOCUMENTS

| | | | | |
|---|---|---|---|---|
| 5,737,052 A | * | 4/1998 | Kimura | G02F 1/13452 257/621 |
| 2002/0000961 A1 | * | 1/2002 | Kang | G02F 1/13452 345/87 |
| 2012/0257361 A1 | * | 10/2012 | Nishi | G02F 1/13452 361/748 |
| 2016/0336532 A1 | | 11/2016 | Li | |

FOREIGN PATENT DOCUMENTS

| CN | 104851892 A | 8/2015 |
|---|---|---|
| JP | 2002-040472 A | 2/2002 |

* cited by examiner

*Primary Examiner* — Lucy P Chien
(74) *Attorney, Agent, or Firm* — ScienBiziP, P.C.

(57) ABSTRACT

A liquid crystal display base includes a liquid crystal module, both a power circuit and a integration circuit, a electric device mounted on the power circuit. The liquid crystal module includes a TFT array substrate and a color filter substrate mounted on the TFT array substrate. The power circuit board mounted on the TFT array substrate. The TFT array substrate has a first surface and a second surface opposite to the first surface, a plurality of through holes extend through the first surface and the second surface, each through hole has equal inner diameter from the first surface to the second surface. the TFT array substrate 11 is made of glass, sapphire, ceramic, a plurality of conductive layers are in the plurality of through holes, both the electric device, the integration circuit and the power circuit board are coupled with the liquid crystal module.

10 Claims, 5 Drawing Sheets

LIQUID CRYSTAL DISPLAY BASE

CROSS-REFERENCE TO RELATED APPLICATIONS

Field

The subject matter herein generally relates to a system, especially, relates to communication control system.

BACKGROUND

Generally, a liquid crystal display base is coupled with a light source to drive the liquid crystal display module.

The liquid crystal display base includes a TFT array substrate, transparent circuit layer formed on the TFT array substrate, an anisotropic conductive film formed on the transparent circuit layer, a power circuit mounted on the anisotropic conductive film, and both a integration circuit and electric device mounted on the power circuit.

The power circuit is flexible and extends laterally from the anisotropic conductive film. The liquid display has a more thickness and lateral width.

BRIEF DESCRIPTION OF THE DRAWINGS

Implementations of the present technology will now be described, by way of example only, with reference to the attached figures.

DETAILED DESCRIPTION OF EMBODIMENTS

It will be appreciated that for simplicity and clarity of illustration, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure. The description is not to be considered as limiting the scope of the embodiments described herein.

Several definitions that apply throughout this disclosure will now be presented. The term "comprising" means "including, but not necessarily limited to"; it specifically indicates open-ended inclusion or membership in a so-described combination, group, series and the like. The term "coupled" is defined as connected, whether directly or indirectly through intervening components, and is not necessarily limited to physical connections. The connection can be such that the objects are permanently connected or releasably connected.

Figure 1:
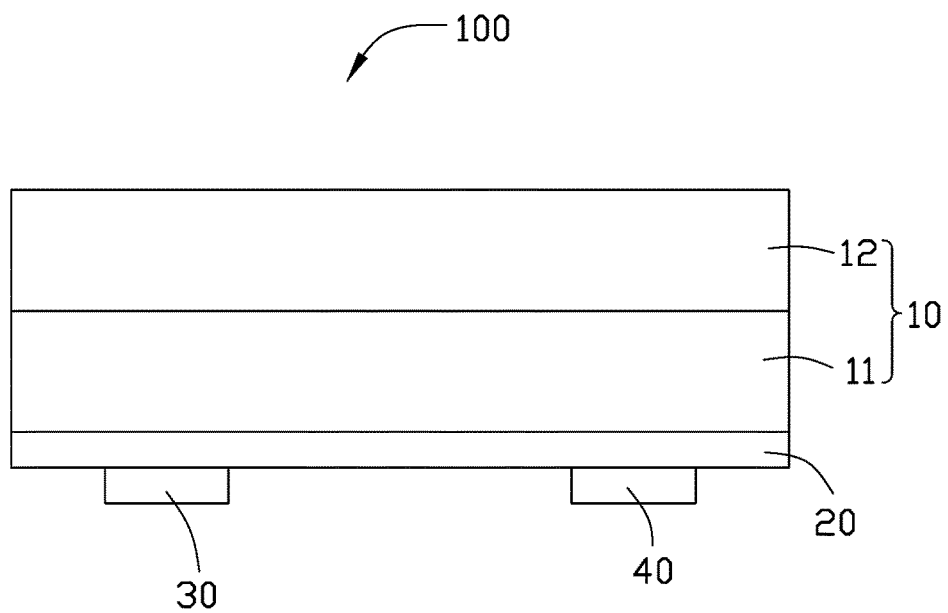
FIG. 1 is a cross-sectional view of a liquid crystal module of a first embodiment of the present disclosure.

Referring to FIG. 1, a liquid crystal display base 100 of a first embodiment includes a liquid crystal module 10, a power circuit board 20, a integration circuit 30 mounted on the power circuit 20, and a electric device 40 mounted on the power circuit 20.

The liquid crystal module 10 includes a thin film transistor (TFT) array substrate 11 and a color filter substrate 12 mounted on the TFT array substrate 11.

The TFT array substrate 11 has a first surface 111 and a second surface 112 opposite to the first surface 111. The TFT array substrate 11 is a materials selected from glass, sapphire, ceramic.

Figure 2:
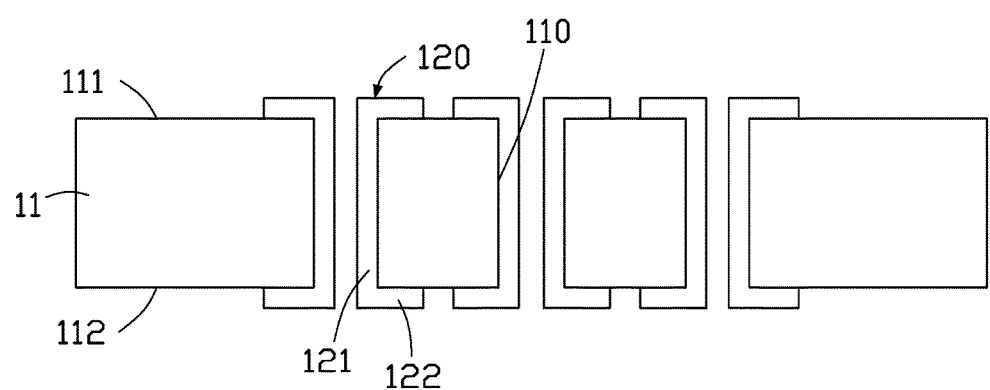
FIG. 2 is a cross-sectional view of a TFT array substrate of the liquid crystal module of the first embodiment.

Also referring to FIG. 2, The TFT array substrate 11 forms a plurality of through holes 110. Each through hole 110 extends through the first surface 111 and the second surface 112. An inner diameter of each through hole 110 is equal from the first surface 111 to the second surface 112.

A plurality of conductive layers 120 are formed on an inner surface of the plurality of through holes 110 and also formed on the first surface 111 and the second surface 112 of the TFT array substrate 11. The plurality of the conductive layers 20 are corresponding to the plurality of through holes 110. Each conductive layer 120 includes a main portion 121 and an extending portion 122 extended from two ends of the main portion 121. The extending portions 122 are perpendicularly to the main portion 121 and are on the TFT substrate 11. The main portion 121 forms on the inner surface of the plurality of the through holes 110. The extending portions 122 contact to the first surface 111 and the second surface 112 of the TFT array substrate 11.

In the first embodiment, the conductive layer 120 is made of In, Zn, Cu, Au, Ag.

The power circuit board 20 mounts on the second surface 112 of the TFT array substrate 11. The power circuit 20 is coupled with the conductive layer 120.

The integration circuit 30 is coupled with the power circuit 20. The electric device 40 is coupled with the integration circuit 30.

The color filter substrate 12, the TFT array substrate 11, the power circuit are arranged in series from a top to a bottom of the crystal display base 100, thus, crystal display base 100 is a more compact. The plurality of conductive layers 120 are formed on an inner surface of the plurality of through holes 110 and the TFT array substrate 11 to couple with the power circuit 30, electric device 40 and the color filter substrate. The crystal display base 100 has a good conductivity.

Figure 3:
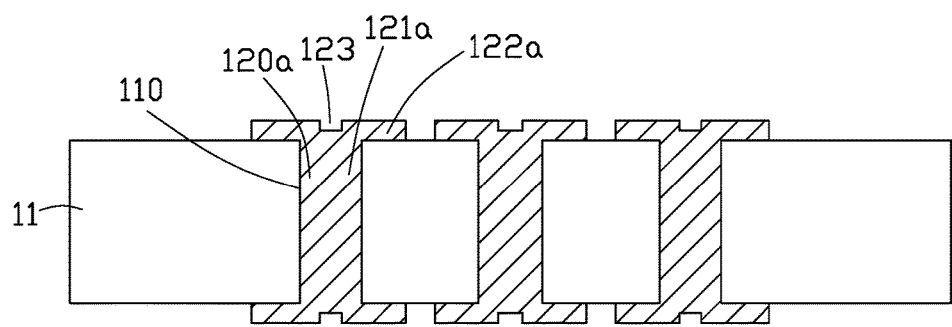
FIG. 3 is a cross-sectional view of a TFT array substrate of a liquid crystal module of a second embodiment.

Referring to FIG. 3, a liquid crystal display base 100a of a second embodiment is similar to the liquid crystal display base 100 of the first embodiment, the difference is: a plurality of conductive layers 120a are fully filled in the plurality of the through holes 110. Each conductive layer 120 includes a main portion 121a and an extending portion 122a extended from two top edges of the main portion 121a. The main portion 121 is fully filled in the through hole 110. The extending portion 122a is on the first surface 111 and the second surface 112 of the TFT array substrate 11. The extending portion 122a and the main portion 121a together define a gap 123. The gap 123 increases heat dissipating of the conductive layer 110.

In the second embodiment, the plurality of conductive layers 120a are fully filled in the plurality of the through holes 110, the crystal display base 100a has a better conductivity.

Figure 4:
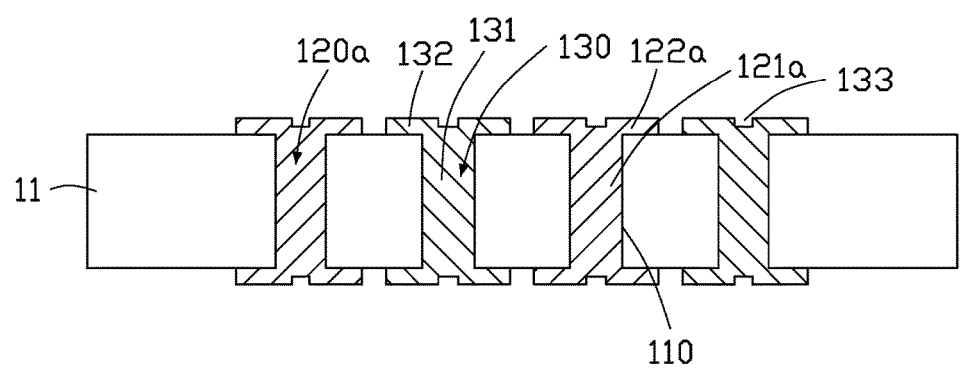
FIG. 4 is a cross-sectional view of a TFT array substrate of a liquid crystal module of a third embodiment.

Referring to FIG. 4, a liquid crystal display base 100b disclosed in the third embodiment is similar to the liquid crystal display base 100a of the second embodiment, the difference is: a plurality of isolation layers 130 are fully filled in the plurality of the through holes 110. Each of the isolation layers 130 is located between two adjacent conductive layers 120a. The plurality of the isolation layers 130 have the same shape with the plurality of the conductive layers 120a. Each isolation layer 130 includes a main portion 131 and an extending portion 132 extended from two top edges of the main portion 131. The main portion 131 is filled in the through hole 110. The extending portion 132 is on the first surface 111 and the second surface 112. The extending portion 131 of the isolation layer 130 is spaced from the extending portion 122a of the conductive layer 120a. The extending portion 131 and the main portion 131 of the isolation layer 130 together define another gap 133.

The plurality of conductive layers 120b is made at least one of In, Zn, Cu, Au, Ag. The plurality of isolation layers 130 is made of SOG, SiOx, PMMA, SiOxNy, or SiNx.

In the third embodiment, the plurality of isolation layer 130 and the conductive layer 120b are fully filled in the plurality of the through holes 110. The isolation layer 130 can insulate the isolation layer 130, thus, the liquid crystal display base 100b has good electrical connection stability.

Figure 5:
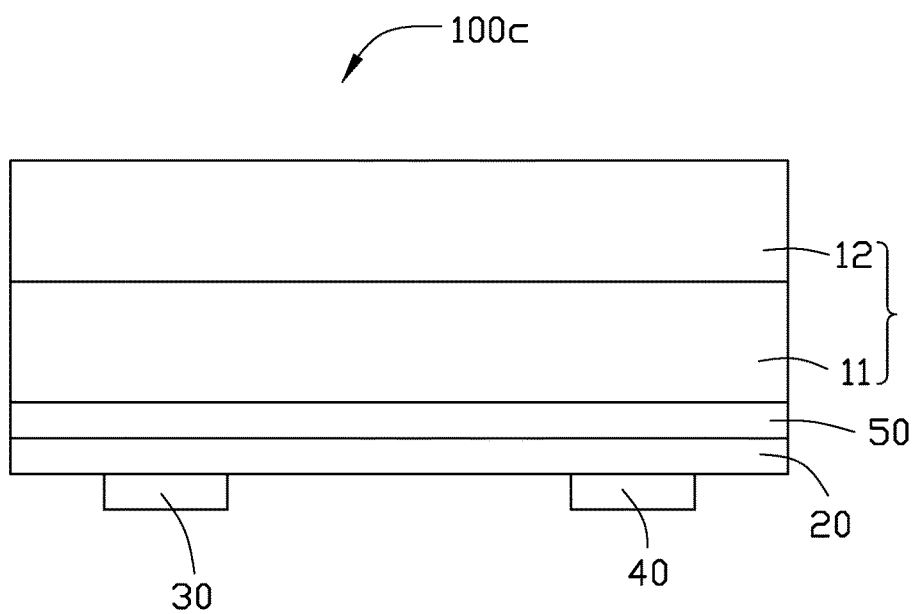
FIG. 5 is a cross-sectional view of a liquid crystal module of a fourth embodiment of the present disclosure.

Referring to FIG. 5, a liquid crystal display base 100c disclosed in the fourth embodiment is similar to the liquid crystal display base 100 of the first embodiment, the difference is: the liquid crystal display base 100c of the fourth embodiment also includes an anisotropic conductive film 50. The anisotropic conductive film 50 is mounted between the TFT array substrate 11 of the liquid crystal module 10 and the power circuit board 20. The anisotropic conductive film 50 do not only connects the power circuit 20 and the TFT array substrate 11, but also can increases a conductivity between the power circuit 20 and the TFT array substrate 11.

The embodiments shown and described above are only examples. Many details are often found in the art such as the other features of a liquid crystal display base. Therefore, many such details are neither shown nor described. Even though numerous characteristics and advantages of the present technology have been set forth in the foregoing description, together with details of the structure and function of the present disclosure, the disclosure is illustrative only, and changes can be made in the detail, including in matters of shape, size and arrangement of the parts within the principles of the present disclosure up to, and including the full extent established by the broad general meaning of the terms used in the claims. It will therefore be appreciated that the embodiments described above can be modified within the scope of the claims.

What is claimed is:

1. A liquid crystal display base, comprising:
   a liquid crystal module comprising a thin film transistor (TFT) array substrate and a color filter substrate mounted on the TFT array substrate;
   a power circuit board mounted on the TFT array substrate;
   a integration circuit mounted on the power circuit board;
   a electric device mounted on the power circuit board;
   wherein the TFT array substrate has a first surface and a second surface opposite to the first surface, a plurality of through holes extend through the first surface and the second surface, each through hole has equal inner diameter from the first surface to the second surface, the TFT array substrate is made of glass, sapphire, ceramic, a plurality of conductive layers are in the plurality of through holes, both the electric device, the integration circuit and the power circuit board are coupled with the liquid crystal module by the plurality of the conductive layers, the plurality of the conductive layers are corresponding to the plurality of through holes, each conductive layer comprises a main portion and an extending portion extended from two ends of the main portion, each conductive layer comprises a main portion and an extending portion extended from two edges of the main portion, the main portion is fully filled in the through hole, the extending portion is on the first surface and the second surface of the TFT array substrate.

2. The liquid crystal display base of claim 1, wherein the main portion forms on the inner surface of the through hole, the extending portion forms on the first surface and the second surface of the TFT array substrate, the extending portion is perpendicularly to the main portion.

3. The liquid crystal display base of claim 1, wherein the conductive layer 120 is made of In, Zn, Cu, Au, Ag.

4. The liquid crystal display base of claim 1, wherein the power circuit board mounts on the second surface of the TFT array substrate, the power circuit board is coupled with the conductive layer.

5. The liquid crystal display base of claim 1, wherein the extending portion and the main portion together define a gap for heat dissipating.

6. The liquid crystal display base of claim 1, wherein the liquid crystal display base further comprises a plurality of isolation layers, the plurality of isolation layers and the plurality of conductive layers are respectively filled in the plurality of the through holes, each of the isolation layer is located between two adjacent conductive layers.

7. The liquid crystal display base of claim 6, wherein each of the isolation layer has the same shape with each of the conductive, the plurality of conductive layer is made of In, Zn, Cu, Au, Ag, the plurality of isolation layers is made of SOG, SiOx, PMMA, SiOxNy, or SiNx.

8. The liquid crystal display base of claim 6, wherein each isolation layer comprises a main portion and an extending portion extended from two top edges of the main portion, the main portion is fully filled in the through hole, the extending portion is on the first surface and the second surface of the TFT array substrate.

9. The liquid crystal display base of claim 8, wherein the extending portion of the isolation is spaced from the extending portion of the conductive layer, the extending portion and the main portion of the isolation layer together define another gap.

10. The liquid crystal display base of claim 8, wherein the liquid crystal display base further comprises an anisotropic conductive film, the anisotropic conductive film mounts between the TFT array substrate and the power circuit board.

* * * * *